(12) United States Patent
Kitazume

(10) Patent No.: US 8,002,601 B2
(45) Date of Patent: Aug. 23, 2011

(54) ORGANIC ELECTROLUMINESCENT DEVICE AND THE MANUFACTURING METHOD

(75) Inventor: Eiichi Kitazume, Tokyo (JP)

(73) Assignee: Toppan Printing Co., Ltd. (JP)

( * ) Notice: Subject to any disclaimer, the term of this patent is extended or adjusted under 35 U.S.C. 154(b) by 0 days.

(21) Appl. No.: 12/698,962

(22) Filed: Feb. 2, 2010

(65) Prior Publication Data

US 2010/0136220 A1  Jun. 3, 2010

Related U.S. Application Data

(63) Continuation of application No. 11/396,089, filed on Mar. 31, 2006, now Pat. No. 7,682,210.

(30) Foreign Application Priority Data

Mar. 31, 2005  (JP) .................................. 2005-102676

(51) Int. Cl.
 *H01J 9/24* (2006.01)
(52) U.S. Cl. ........... 445/24; 313/504; 313/506; 313/509
(58) Field of Classification Search .................... 445/24; 313/498–512
 See application file for complete search history.

(56) References Cited

U.S. PATENT DOCUMENTS

| | | | | |
|---|---|---|---|---|
| 6,114,805 A | * | 9/2000 | Codama et al. | ............... 313/509 |
| 6,351,066 B1 | * | 2/2002 | Gyoutoku et al. | ............. 313/504 |
| 2004/0094768 A1 | | 5/2004 | Yu et al. | |
| 2004/0182266 A1 | * | 9/2004 | Asato et al. | .................... 101/401 |
| 2005/0023969 A1 | * | 2/2005 | Omata et al. | ................... 313/504 |
| 2005/0134170 A1 | * | 6/2005 | Otani et al. | .................... 313/504 |
| 2005/0184654 A1 | | 8/2005 | Kobayashi | |
| 2005/0212841 A1 | | 9/2005 | Okano | |
| 2005/0238799 A1 | | 10/2005 | Seki et al. | |
| 2006/0028124 A1 | | 2/2006 | Chu et al. | |
| 2006/0197441 A1 | | 9/2006 | Tsai et al. | |

FOREIGN PATENT DOCUMENTS

| | | |
|---|---|---|
| JP | 2001-093666 | 4/2001 |
| JP | 2001-155858 | 6/2001 |
| JP | 2003-229267 | 8/2003 |
| JP | 2003-243163 | 8/2003 |
| JP | 2004-071432 | 3/2004 |
| JP | 2004-127897 | 4/2004 |

OTHER PUBLICATIONS

Notification of Reasons for Refusal for appl. No. 2005-102676, mailed Sep. 7, 2010, 3 pgs.
Translation of Notification of Reasons for Refusal for appl. No. 2005-102676, mailed Sep. 7, 2010, 3 pgs.

* cited by examiner

*Primary Examiner* — Bumsuk Won
(74) *Attorney, Agent, or Firm* — Squire, Sanders & Dempsey (US) LLP

(57) ABSTRACT

An organic electroluminescent device is disclosed. The device can include a substrate, a first electrode on the substrate, a partition wall next to the first electrode, an organic luminescence media layer including an organic luminous layer on the first electrode, and a second electrode which is on the organic luminescence media layer and facing the first electrodes, wherein the partition wall comprises a first partition wall and a second partition wall, the first partition wall covers a part of the first electrode, and the second partition wall is located on an inner side of the first partition wall.

7 Claims, 4 Drawing Sheets

ORGANIC ELECTROLUMINESCENT DEVICE AND THE MANUFACTURING METHOD

CROSS REFERENCE

This is a continuation of U.S. patent application Ser. No. 11/396,089, filed on Mar. 31, 2006, which claims priority to Japanese application number 2005-102676, filed on Mar. 31, 2005, both of which are incorporated by reference.

BACKGROUND OF THE INVENTION

1. Field of the Invention

The present invention is related to an organic electroluminescent device and its manufacturing method. The present invention is related to an organic electroluminescent device and a manufacturing method comprising formation of an organic luminous layer by a wet method with the use of an organic luminescence ink, wherein the organic luminous layer formation material is dissolved in a solvent.

2. Description of the Related Art

An organic electroluminescent device has an organic luminous layer comprising organic luminescent material between two opposing electrodes. By means of applying electric current to the organic luminous layer between both electrodes, the organic luminous layer emits light. Organic luminescence layer thickness is important so that the organic luminous layer emits light efficiently. Organic luminescence layer thickness has to be about 100 nm. Even more particularly, for example, it is necessary to form a pattern of R (red), G (green), and B (blue) with high accuracy to make this a display panel.

Low molecular materials and polymeric material are examples of organic luminescent materials that can be used to form the organic luminous layer. Generally, as for low molecular materials, thin film is formed by vacuum evaporation. A mask with minute patterns is used at this time, and patterns are formed. In a manufacturing method with the use of vacuum processing such as vacuum evaporation, upsizing of a substrate can diminish the accuracy of the patterning. In addition, due to layering in vacuum, throughput is bad.

Thus the following method is tried recently. Macromolecular organic luminescent material is dissolved in a solvent, and coating slip is made. This coating slip is used, and thin film is formed by wet coating method. As wet coating methods to form thin film, spin coating method, bar coat method, extrusion coat method, dip coat method are exemplified.

It is difficult to form high minute pattern by a wet coating. In addition, it is difficult to paint so that three colors of the pattern of RGB are separated.

As for the formation method of thin film by a printing method, a separated pattern is formed more easily. Therefore, formation method of thin film by a printing method is more effective.

As for methods to print this organic luminescence ink, the following methods are exemplified: Offset printing (Japanese Patent Laid-Open No. 2001-93668 Official Gazette) to use rubber blanket having elasticity; relief printing method (Japanese Patent Laid-Open No. 2001-155858 Official Gazette) to use rubber printing plate and resin printing plate having elasticity; and ink jet method (Japanese Patent Laid-Open No. 2002-305077 Official Gazette).

Solubility of an organic luminescent material in a solvent can be low. When organic luminescence ink is made by means of dissolution in a solvent of these organic luminescent materials, concentration of organic luminescent material should be about 1%. Therefore, organic luminescence ink is the ink has a low viscosity.

In the case of formation of the organic luminous layer on a substrate by relief printing method, the organic luminescence ink having low viscosity of a concentration of about 1% is just transferred on a substrate from relief printing plate. In the case of the formation of the organic luminous layer on a substrate by ink jet method, organic luminescence ink discharged by ink jet nozzles of ink jet devices just fall into a substrate. It paints so that three color patterns of R, G and B are separated.

When organic luminescence ink of low viscosity is used, organic luminescence ink supplied on a substrate spreads. Therefore, organic luminescence inks of different luminescent colors are mixed. Color contamination occurs.

Thus, the following method has been proposed to control spreading of organic luminescence ink. Partition walls are made between first electrodes. Organic luminescence ink is printed onto first electrodes partitioned off by partition walls. Color contamination by spreading of inks can be prevented by the partition walls between first electrodes.

Partition walls are formed between pattern-shaped electrodes. Organic luminescence ink is used, and an organic luminous layer is formed. When a side surface of the partition wall is wettable to the organic luminescence ink, an organic luminescence layer thickness near the partition wall is bigger than the thickness of the middle of pixel after drying of organic luminescence ink. Therefore, luminance unevenness in a pixel occurs due to difference between organic luminescence layer thickness near the partition wall and organic luminescence layer thickness of the middle of pixel.

On the other hand, when side surfaces of the partition walls have organic luminescence ink repellency, organic luminescence layer thickness near the partition walls is thinner than that of the middle of pixel. In the organic luminous layer near partition walls, breakdown of the organic luminous layer occurs by electric field concentration due to the thickness being thin. In addition, luminance unevenness in a pixel occurs.

Profile explanatory drawing of a conventional organic electroluminescent device is shown in FIG. 1 (*a*). In addition, FIG. 1 (*b*), (*c*) are the extended figures of FIG. 1 (*a*). First electrode is patterned on substrate 1. Partition walls 7 are provided between patterns of first electrodes 2. Hole transport layer 3 is formed on the first electrodes 2 partitioned off by means of partition walls 7. Red (R) organic luminous layer 41, green (G) organic luminous layer 42 and blue (B) organic luminous layer 43 are formed on hole transport layer 3, respectively. And the second electrode 5 is formed on organic luminous layer (41, 42, 43). An organic luminous layer or a hole transport layer is formed by a wet method such as a printing method or coating method.

FIG. 1 (*b*) is a figure to show the case that side surfaces of partition walls are ink wettable. Organic luminescence layer thickness near partition walls is thicker than thickness of the middle of pixel. Due to nonuniformity of thickness of an organic luminous layer and a hole transport layer near partition walls, luminance unevenness in a pixel is caused. L is a light emitting area.

In addition, FIG. 1 (*c*) is a figure to show the case that side surfaces of partition walls have ink repellency. Organic luminescence layer thickness near partition wall is thinner than organic luminescence layer thickness in the middle of pixel. Due to nonuniformity of thickness of an organic luminous layer and a hole transport layer, luminance unevenness in a pixel is caused. Even more particularly, due to electric field concentration in a thin part of thickness near partition walls, breakdown of the organic luminous layer is caused.

Due to a difference of affinity of partition wall to organic luminescence ink, organic luminescence layer thickness near partition walls changes. Due to change of this organic luminescence layer thickness, luminance unevenness in a pixel and breakdown by electric field concentration occur. It is necessary to select formation material of organic luminescence ink or partition wall appropriately to prevent luminance unevenness in a pixel and a breakdown by electric field concentration. The method of how additive controlling affinity between ink and partition wall is mixed with organic luminescence ink or partition wall material is suggested. These additives may have harmful effect on luminescence property of an organic electroluminescent display unit. Therefore, the selection of additive is very difficult.

According to the present invention, organic luminescence ink comprising organic luminescent material is used, and an organic luminous layer is formed in pixel electrodes partitioned off by partition walls. The present invention provides an organic electroluminescent display unit without luminance unevenness in a pixel and dielectric breakdown by electric field concentration due to change of organic luminescence layer thickness near partition walls.

SUMMARY OF THE INVENTION

In an embodiment of the present invention, a partition wall can include a first partition wall and a second partition wall. The first partition wall, having insulating properties, covers one part of the first electrode. The second partition wall is located in an inner side of the first partition wall. Height of the first partition wall can be equal to or less than 0.5 µm. Therefore, electric current flows through only a part of pixel electrodes except a part provided with the first partition wall. Only a part of uniform thickness of an organic luminous layer emits light.

In other words, on a part near the partition wall that change of organic luminescence layer thickness is big, there is a step formed by the first partition wall and the second partition wall. Electric current does not flow to the part of this step. Therefore, an organic electroluminescent display unit without unevenness in a pixel and dielectric breakdown by electric field concentration is provided.

In addition, in some embodiments, when height of the second partition wall is more than 0.3 µm, organic luminescence ink does not spread to the next pixel electrodes. Therefore, an organic electroluminescent display unit without color contamination can be obtained.

In addition, organic luminescence ink is printed onto the first electrode partitioned off by partition walls by relief printing method. Therefore, a whole area in pixel electrodes is printed. An organic electroluminescent display unit is made without the ink being repelled.

DESCRIPTION OF THE PREFERRED EMBODIMENTS

Figure 1:
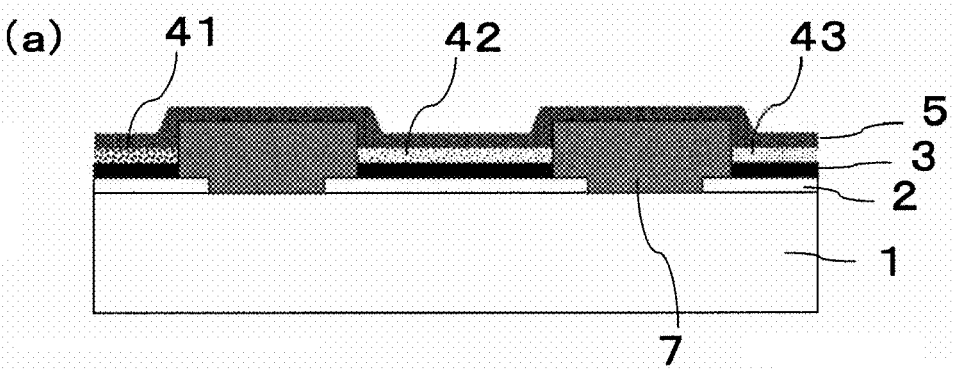
FIGS. 1 (a), (b), and (c) are cross-sectional figures of an conventional organic electroluminescent device.
Figure 1:
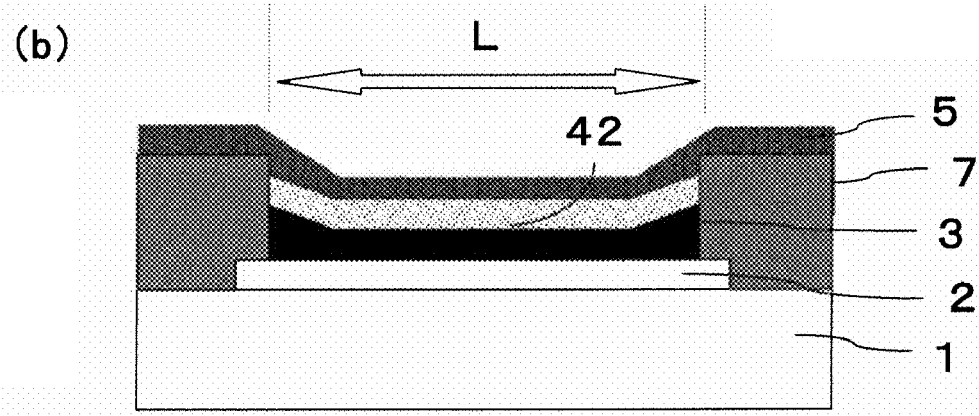
Figure 1:
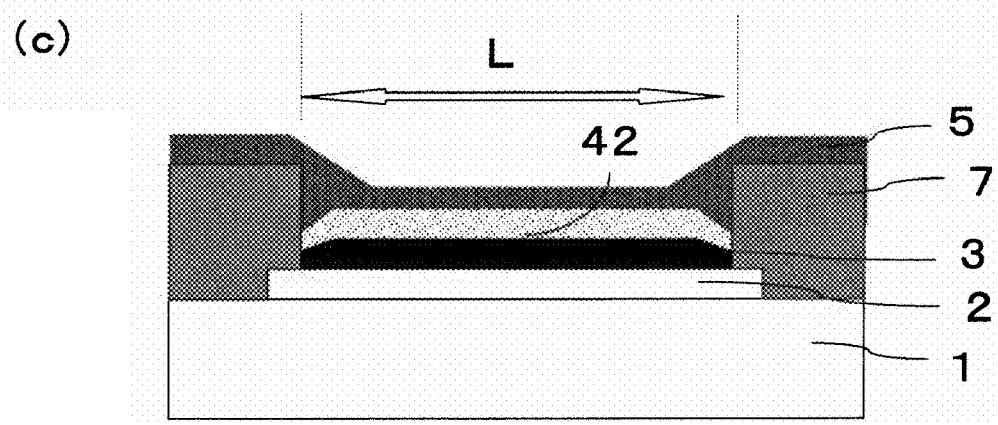
Figure 2:
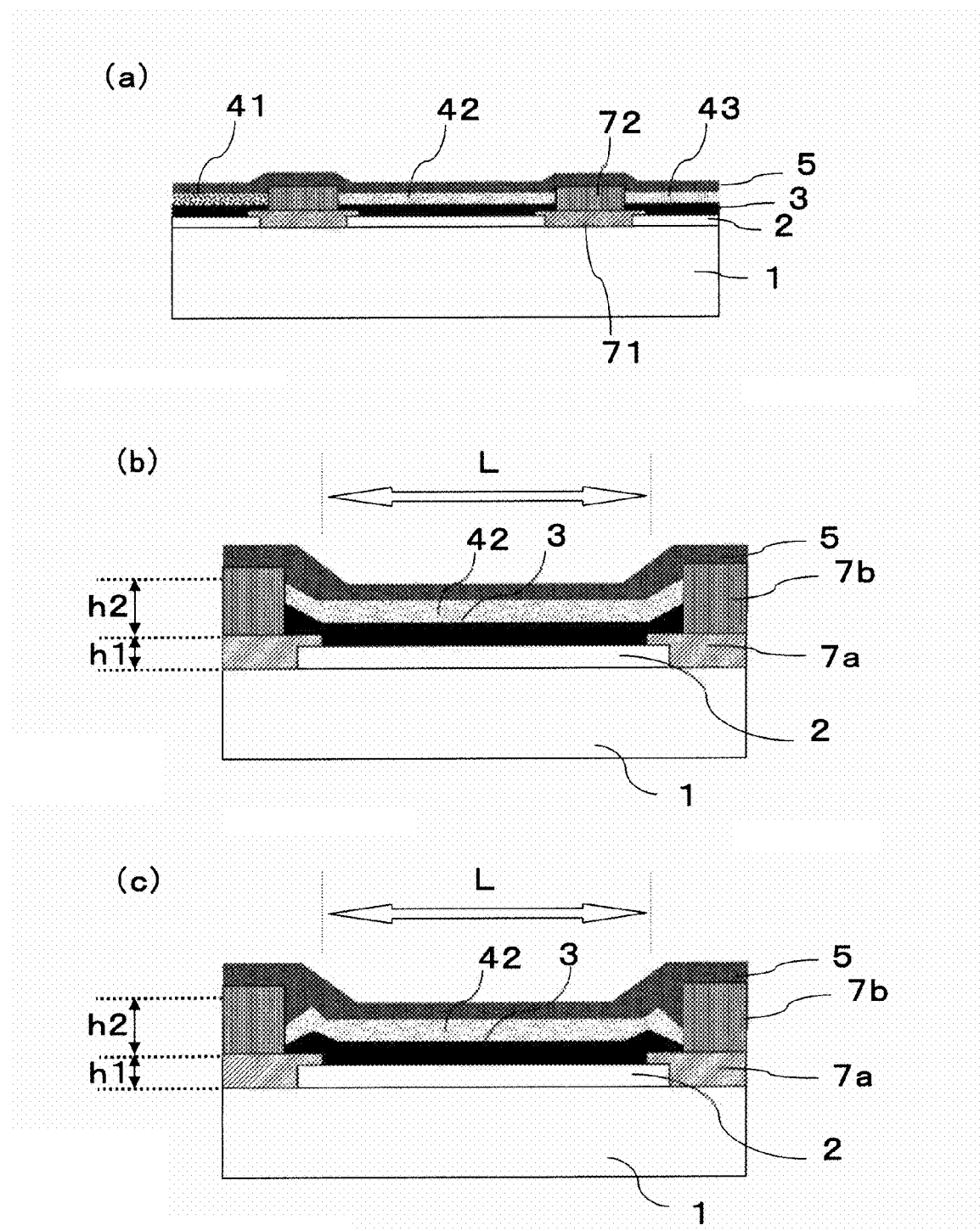
FIGS. 2 (a), (b), and (c) are cross-sectional figures of an organic electroluminescent device of embodiments of the present invention.

Organic electroluminescent device of the present invention is explained. An embodiment of a cross-section of an organic electroluminescent device of the present invention is shown in FIG. 2 (a). But the present invention is not limited to FIG. 2 (a). In addition, FIGS. 2 (b) and (c) are the extended figures of FIG. 2 (a). FIGS. 2 (a), (b), and (c) are sometimes collectively or individually referred to as FIG. 2.

In FIG. 2, pattern-shaped first electrode 2 is formed on substrate 1. In the case of passive matrix method, this first electrode 2 is stripe-shaped pattern. In the case of active matrix method, the first electrode 2 is pattern formed by every pixel.

As a driving method of organic electroluminescent device, passive matrix method and active matrix method are exemplified. Organic electroluminescent device of the present invention can be applied to either an organic electroluminescent device of a passive matrix method or organic electroluminescent device of active a matrix method.

Passive matrix method is explained. Stripe-shaped electrodes are opposed to be perpendicular. The intersection point emits light.

Active matrix method is explained. So-called thin film transistor (TFT) substrate, on which a transistor is formed, every pixel is used. Every pixel emits light independently.

The first partition walls 7a are formed between patternized first electrodes 2. The second partition walls 7b are formed on the first partition walls 7a.

In one embodiment of the present invention, the second partition wall is located in an inner side of the first partition walls. An organic luminescence media layer including an organic luminous layer can be formed on the first electrode partitioned off by partition walls comprising the first partition wall and the second partition wall. An organic luminescence media layer can be a stacked layer having the following layer in addition to the organic luminous layer: A hole injection layer, a hole transport layer, an electronic blocking layer, an electronic transport layer and an electron injection layer.

FIG. 2 is a figure which shows the configuration which a hole transport layer and an organic luminous layer are formed on the first electrode. The organic luminous layers are three color patterns of red (R) organic luminous layer 41, green (G) organic luminous layer 42 and blue (B) organic luminous layer 43. The second electrode 5 is placed on an organic luminescence media layer comprising hole transport layer 3 and organic luminous layer (41, 42, 43). The second electrode 5 faces the first electrode 2. In the case of passive matrix method, the second electrode 5 comprises a shape of a stripe. The second electrode 5 is perpendicular to the stripe-shaped first electrode. In the case of active matrix method, the second electrode 5 is formed on a whole area of organic electroluminescent device.

In FIG. 2 (b), the configuration which an organic luminous layer and a hole transport layer are formed by means of the wet method which uses ink is shown. Affinity between organic luminescence ink, hole transport ink and partition wall is high. Thickness of an organic luminous layer and a hole transport layer is thicker in a neighborhood of the second partition wall. In FIG. 2 (c), the configuration which an organic luminous layer and a hole transport layer are formed by means of the wet method which uses ink is shown. Affinity between organic luminescence ink, hole transport ink and partition walls is high. In neighborhood of the second partition walls, thickness of an organic luminous layer and a hole transport layer is big.

L is a light emitting area in each organic electroluminescent device.

As is shown by FIG. 2 (b), FIG. 2 (c), in neighborhood of the second partition walls, a change of organic luminescence layer thickness is big. The part that a change of organic luminescence layer thickness is big is located on steps comprised of the first partition walls and the second partition walls. In the part that a change of this thickness is big, electric current does not flow due to the first partition wall having insulating properties. Thus, in FIG. 2 (b), FIG. 2 (c), only the part that a change of thickness of an organic luminous layer and a hole transport layer is small is a light emitting area.

It is preferable for height h1 of the first partition wall to be equal to or less than 0.5 μm. Thickness of pixel electrodes can be 0.1 μm-0.2 μm. When height of the first partition wall is more than 0.5 μm, a change of organic luminescence layer thickness is big in a neighborhood of side surfaces of the first partition walls. Therefore, luminance unevenness occurs in a pixel. The first partition walls have to cover one part of pixel electrodes. In addition, it is desirable for the first partition walls to be as low as possible.

It is preferable for height h2 of the second partition walls to be more than 0.3 μm. When height of the second partition walls is equal to or less than 0.3 μm, organic luminescence ink spreads to the next pixel. Color contamination occurs.

In some embodiments, in organic electroluminescent device of passive matrix type, the first partition walls and the second partition walls are provided between first electrodes. The second electrode which is perpendicular to the first partition walls is formed. In addition, in organic electroluminescent device of active matrix method, the second electrode is formed on a whole area of device. This way a cathode layer is formed to step over partition walls. In this case, when partition wall is too high, breaking of second electrode can occur. When the total height of the first partition wall and the second partition wall exceeds 5.0 μm, disconnection of cathode can occur. It is desirable that the total height of the first partition wall and the second partition wall be less than 5.0 μm.

A manufacturing method of organic electroluminescent device of some embodiments the present invention is described next.

Organic electroluminescent device of the present invention is formed on substrate 1. For substrate 1, a glass substrate and a metal plate, a film made of plastic or sheet can be used. In the case of bottom emission method, a substrate has to be transparent. By use of a film made of plastic, organic electroluminescent device can be produced by reel up. Therefore, an inexpensive display panel can be provided.

As for the plastic, polyethylene terephthalate, polypropylene, cyclo olefin polymers, polyamide, polyethersulfone, polymethyl methacrylate, and polycarbonate can be used.

In addition, barrier layer with steam barrier properties and oxygen barrier properties comprising the following material is installed in these films as necessary: Metallic oxide such as silicon oxide, oxidation nitride such as silicon nitride, polyvinylidene chloride, polyvinyl chloride and ethylene-vinyl acetate copolymer saponification material.

Figure 3:
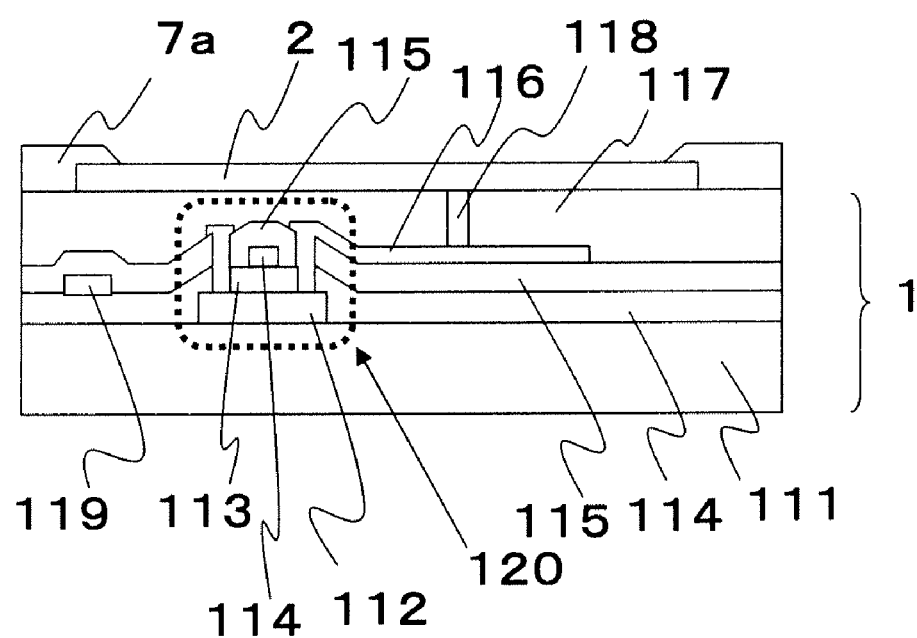
FIG. 3 is a cross-sectional figure of a substrate of an active matrix mode of an embodiment of the present invention.

In addition, thin film transistor (TFT) is formed on a substrate, and a substrate for organic electroluminescent device of active matrix method can be made. A cross-sectional illustration of an example of a substrate of active matrix method of the present invention is shown in FIG. 3. On TFT 120, planarizing layer 117 is formed. A bottom electrode (the first electrode 2) of organic electroluminescent device is formed on planarizing layer 117. Contact hole 118 is installed in planarizing layer 117. The bottom electrode is electrically connected to TFT by means of contact hole 118. Due to such a constitution, superior electrical insulating properties can be achieved between TFT and organic electroluminescent device.

TFT 120 and the upward organic electroluminescent device can be supported with support medium 111. Support medium 111 should be superior in mechanical intensity and dimensional stability. Materials exemplified as material of a substrate can be used as material of support medium 111.

For thin film transistor 120 on a support medium, well-known thin film transistor can be used. Thin film transistor comprising the active layer having a source/drain region and a channel area are formed, and the gate insulator and the gate electrode is exemplified. Configuration of thin film transistor is not limited to such configurations. By way of example only, staggered type, reverse staggered type, top gate type, and Coplanar type can also be used.

Active layer 112 can be formed by inorganic semiconductor material such as amorphous Si, polycrystalline silicon, crystalline Si, cadmium selenide or organic semiconductor material such as thiophene oligomer, and poly(phenylene vinylene).

These active layers are made by the following methods:
1. A method of ion doping after forming amorphous silicon by plasma CVD technique.
2. A method comprising the following process: Amorphous silicon is formed by LPCVD method using SiH4 gas. By means of crystallization of amorphous silicon by solid phase epitaxy, a polySi is obtained and ion doping is done by ion implantation method;
3. A low temperature processing method comprising the following process: Amorphous silicon is formed. By way of example only, $Si_2H_6$ gas is used, and amorphous silicon is formed by LPCVD method. Amorphous silicon is formed by PECVD method by means of SiH4 gas. It is annealed by laser such as excimer lasers. A polySi is obtained by crystallization of amorphous silicon. Ion doping is done by ion doping method.
4. A high temperature processing method comprising the following process: A polySi is formed by low pressure CVD method or LPCVD method. Thermal oxidation is done in more than 1,000 degrees Celsius, and gate insulator is formed. Thereupon, gate electrode 114 of an n+ polySi is formed. Ion doping is done by ion implantation method.

For gate insulator 113, conventional gate insulator can be used. By way of example only, $SiO_2$ formed by PECVD method, LPCVD method, or $SiO_2$ made by thermal oxidation of polysilicon film can be used.

For gate electrode 114, conventional gate electrode can be used. By way of example only, metal such as aluminum, copper, refractory metal such as titanium, tantalum, tungsten, a polySi, silicide of refractory metal, and polycide can be used.

For configuration of thin film transistor 120, a single gate structure, a double gate structure, multiple gating configuration having gate electrode more than 3 are exemplified. In addition, LDD configuration, offset configuration may be provided. Even more particularly, thin film transistor more than 2 may be placed for one pixel.

In some embodiments, it is necessary for a display unit of the present invention to be connected to so that thin film transistor functions as a switching element of organic electroluminescent device. Drain electrode 116 of transistor is electrically connected with pixel electrodes (the first electrodes) of organic electroluminescent device. In the case of top emission configuration, it is necessary for metal reflecting back light generally to be used as pixel electrodes.

Drain electrode 116 of thin film transistor 120 can be connected with pixel electrodes (the first electrodes) of organic electroluminescent device by connection electric wiring. Connection electric wiring can be formed in contact hole 118 penetrating through planarizing layer 117.

For material of planarizing layer 117, inorganic materials such as $SiO_2$, spin-on-glass, SiN ($Si_3N_4$), TaO ($Ta_2O_5$), organic materials such as polyimide resin, acrylic resin, photoresist material, and black matrix material can be used. Spin coating, CVD, and evaporation method can be selected depending on these materials. A photosensitive resin is used as a planarizing layer if necessary, and, by procedure of photolithography, contact hole 118 is formed. Or after having formed a planarizing layer on a whole area, contact hole 118 is formed in dry etching or wet etching in position corresponding to lower thin film transistor 120. Contact hole is buried by conductive material. And, the contact hole is connected with pixel electrodes on a planarizing layer. A planarizing layer should be able to cover up the TFT, capacitor, and electric wiring. Thickness of the planarizing layer should be several μm, and, by way of example only, it can be about 3 μm.

The first electrode is formed on a substrate. When the first electrode is anode, the following material can be used: Metal complex oxide such as ITO (indium tin complex oxide), IZO (indium zinc complex oxide), stannic oxide, zinc oxide, indium oxide, zinc aluminium complex oxide, Metallic substances such as gold, platinum, and chromium as well as a layered stack comprising these materials.

Methods of forming the first electrode include, dry method such as resistance heating evaporation method, electron-beam evaporation technique, reactivity evaporation method, ion plating method, and sputtering method, depending on the material.

In addition, ITO is preferable for reasons of the follows: low electrical resistance; high solvent resistance, and high translucency (in the case of bottom mission method).

ITO is formed on a glass substrate by sputter method. The first electrode is formed by patterning by photolithography method of ITO.

After the formation of the first electrode 2, the first partition wall 7a of insulating properties is formed. The first partition walls 7a are formed between the first electrodes. The first partition walls 7a cover side edges of the first electrodes.

Photosensitive materials can be used as formation material of the first partition wall having insulating properties. A positive type and negative type can be used as a photosensitive material. Light hardening resins such as photo radical polymerization system, photo cation cure corollary or copolymer containing acrylonitrile composition, poly vinylphenol, polyvinyl alcohol, novolac resin, polyimide resin and cyanoethyl pullulan can be used. In addition, as formation material of the first partition wall, metallic oxide such as $SiO_2$, $TiO_2$ or metal nitrides such as silicon nitride can be used.

When formation material of the first partition wall is a photosensitive material, solution of formation material is coated by slit coat method or spin coating method entirely. And patterning can be performed by photolithography method including exposure process and development process. In the case of spin coating method, height of partition wall can be controlled under conditions of rotation number. However, only by one coating, height of partition wall can be limited. If spin-coating process is repeated more than once, partition wall of height more than limited height can be formed.

In addition, when formation material of partition wall is metallic oxide, a metal nitride, partition wall can be formed by dry membrane making method such as sputtering method or chemical vapor deposition. For this case, patterning of partition wall can be performed by mask or photolithography method.

The second partition walls 7b are formed on the first partition walls 7a next. The second partition walls are formed to be located in inner sides of the first partition walls. Due to this configuration, the organic luminous layer near the second partition wall, with an increased change of thickness, does not emit light. The first partition wall having this insulating property disturbs current-flow. Thus, luminance unevenness in a pixel and dielectric breakdown by electric field concentration can be prevented.

For formation material of the second partition wall, photosensitive materials can be used same as formation material of the first partition wall. A positive type and negative type can be used as a photosensitive material. Light hardening resins such as photo radical polymerization system, photo cation cure corollary or copolymer containing acrylonitrile composition, poly vinylphenol, polyvinyl alcohol, novolac resin, polyimide resin and cyanoethyl pullulan can be used. In addition, as formation material of the second partition wall, metallic oxide such as SiO2, TiO2 or metal nitrides such as silicon nitride can be used.

When formation material of the second partition wall is a photosensitive material, solution of formation material can be entirely coated by slit coat method or spin coating method. Patterning of the second partition wall is performed by photolithography method including exposure process and development process. In the case of spin coating method, height of partition wall can be controlled under conditions of rotation number. However application of a single coating can limit the height of the partition wall. If spin-coating process is repeated more than once, partition wall of any suitable height can be formed.

In addition, when formation material of the second partition wall is metallic oxide, a metal nitride, the second partition wall can be formed in dry membrane making method such as sputtering method and chemical vapor deposition. For this case, patterning of partition wall can be performed by mask or photolithography method.

In addition, conductive material can also be used as formation material of the second partition wall. Metal such as chromium is layered by vacuum evaporation, sputtering method, CVD method or plasma CVD technique. And it can be patternized by a photolithography method.

In addition, material to repel ink may be incorporated into formation material of the second partition wall. However, material to repel ink should not affect luminescence property of an organic electroluminescent display unit. Color contamination due to spreading of organic luminescence ink can be prevented by incorporating material to repel ink.

After the formation of the second partition wall 7b, hole transport layer 3 can be formed. A poly aniline derivative, poly thiophenes, a polyvinylcarbazole (PVK) derivative, poly (3,4-ethylenedioxy thiophene) (PEDOT) can be used as formation material of a hole transport layer. By means of dissolution to solvent of these material, hole transport material ink is made. Coating method to use a slit coating machine, a spin coater, a bar coating machine, a roll coater, a die coating machine or an engraved-roll coater and various printing methods such as offset printing, relief printing method, ink jet method, screen printing may be used.

Representative examples of solvents for dissolution of hole transport layer formation material include: Toluene, dimethylbenzene, acetone, methyl ethyl ketone, methyl isobutyl ketone, cyclohexanone, methanol, ethanol, isopropyl alcohol, ethyl acetate, butyl acetate, water and combinations thereof. Water or alcohols are especially preferred. In addition, detergent, antioxidant, viscosity improver, UV absorber may be added in hole transport layer formation material. However, these additives must not affect luminescence property of an organic electroluminescent display unit.

In addition, before the hole transport layer formation, surface treatment such as plasma treatment, UV processing, or UV ozonization may be performed on the substrate. Then the first electrode becomes wettable to hole transport ink.

After the formation of hole transport layer 3, organic luminous layer (41, 42, 43) is formed. For example, in the case of organic electroluminescent device of full color, patterns of red organic luminous layer, green organic luminous layer and blue organic luminous layer are formed.

The following material can be used as organic luminescent material of an organic luminous layer.

The following low molecular type luminescent material can be used:

9,10-diaryl anthracenes, pyrene, coronene, perylene, rubrene, 1,1,4,4-tetra phenylbutadiene, tris (8-hydroxyquinolonate) aluminium complex, tris (4-methyl-8-hydroxyquinolonate) aluminium complex, bis(8-hydroxyquinolonate) zinc complex, tris (4-methyl-5-trifluoromethyl-8-hydroxyquinolonate) aluminium complex, tris (4-methyl-5-cyano-8-hydroxyquinolonate) aluminium complex, bis(2-methyl-5-trifluoromethyl-8-quinolinolate) [4-(4-cyanophenyl) phenolate]aluminium complex, bis(2-methyl-5-cyano-8-quinolinolate) [4-(4-cyanophenyl)phenolate] aluminium complex, tris (8-quinolinolate) scandium complex, bis[8-(para-tosyl)aminoquinoline] zinc complex and cadmium complex, 1,2,3,4-tetraphenylcyclopentadiene and poly-2,5-diheptyloxi-para-phenylenevinylene.

In addition, the material which can scatter the following low molecular type luminescent material in a polymeric material can be used: Coumarin corollary fluorescent substance, perylene corollary fluorescent substance, pyran type fluorescent substance, anthrone corollary fluorescent substance, porphyrin corollary fluorescent substance, quinacridon corollary fluorescent substance, N,N'-dialkyl displacement quinacridon corollary fluorescent substance, naphthalimido corollary fluorescent substance, N,N'-diaryl displacement pyrrolo pyrrole series fluorescent substance and phosphorescence fluor such as Ir chelate. Polystyrene, polymethyl methacrylate and polyvinylcarbazole can be used as a polymeric material.

In addition, the following macromolecule luminescent material can be used: Poly (2-decyloxy-1,4-phenylene) (DO-PPP), poly [2,5-bis-[2-N,N-triethylammonium) ethoxy]-1,4-phenyl-alto-1,4-phenyl Ren] a dibromide (PPP-NEt3+), poly [2-(2-ethyl hexyloxy)-5-methoxy-1,4-phenylenevinylene] (MEH-PPV), poly [5-methoxy-(2-propanoxysulfide) 1,4-phenylenevinylene] (MPS-PPV), poly [2,5-bis-(Hexyloxy)-1,4-phenylene-(1-cyano vinylene)] (CN-PPV), a polyphenylene vinylene (PPV) derivative such as the above, poly (9,9-dioctyl fluorene) (PDAF) and polyspiro. Macromolecule precursor such as PPV precursor, PPP precursor can be used. In addition, existing luminescent material can be used.

Organic luminescence ink can be made by dissolution in a solvent of these organic luminescent materials. As solvent for dissolution of organic luminescent material, toluene, dimethylbenzene, acetone, anisole, methyl ethyl ketone, methyl isobutyl ketone, and cyclohexanone can be used. A combination of these solvents can be used as well. Above all, aromatic organic solvent such as toluene, dimethylbenzene, and anisole is preferred from an aspect of solubility of organic luminescent material. In addition, detergent, antioxidant, viscosity improver, and UV absorber may be added to the organic luminescence ink. However, these additives must not affect luminescence property of an organic electroluminescent display unit.

As a formation method of an organic luminous layer with the use of organic luminescence ink, a relief printing method, an ink jet printing method, an offset printing and a photogravure printing method can be used. Relief printing method preferred.

For an ink jet method, an organic luminescence ink is discharged on a printed part from ink jet nozzles multiple times. Then an organic luminous layer is formed. There is distance between nozzle and printed parts. Ink discharged by ink jet nozzles reflects back in a printed part. Therefore, partition wall has to be sufficiently high.

On the other hand, in relief printing method, relief printing plate touches a printed part. Therefore, scattering of ink by reflection of ink does not occur. Therefore, partition wall may be low.

In addition, in ink jet method, ink discharged by ink jet nozzles is supplied on a printed part. And ink spreads on a printed part partitioned off by partition wall only by means of weight of the ink.

On the other hand, a convex part touches a printed part in relief printing method. Relief printing plate pushes ink. Relief printing plate buries space partitioned off by partition wall. The ink expands on a printed part partitioned off by partition wall to a lateral direction. Organic luminescence ink is hard to be printed near partition wall by ink jet method. Therefore, the point where there is no ink is easy to occur. In relief printing method, ink is hard to repel.

Figure 4:
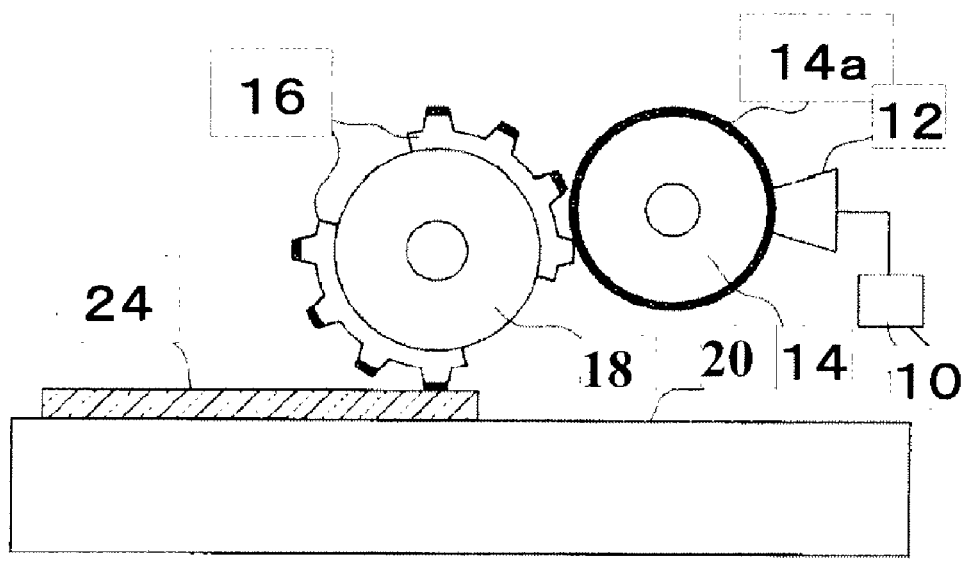
FIG. 4 shows a schematic illustration of relief printing device of an embodiment of the present invention.

A schematic illustration of relief printing device is shown in FIG. 4. Organic luminescence ink comprising organic luminescent material is printed in the shape of a pattern on a substrate. In a substrate, the first electrode, the partition wall comprising the first partition wall and the second partition wall, and a hole transport layer are formed. Relief printing device has ink tank 10, ink chamber 12, anilox roll 14 and plate cylinder 18 on which relief printing plate 16 is placed. Organic luminescence ink diluted with a solvent is taken to ink tank 10. Organic luminescence ink is sent into ink chamber 12 from ink tank 10. Anilox roll 14 contacts with ink feed section of ink chamber 12, and it is rotatably supported.

With rotation of anilox roll 14, ink layer 14a of organic luminescence ink supplied to anilox roll surface is uniformly formed. The ink of this ink layer is transferred to relief printing plate 16 carried by plate cylinder 18 by being rotationally driven in proximity to anilox roll. The substrate on which transparent electrode and a hole transport layer are formed is transported to printing position of flat-bed printing machine 20 by the transporting means that is not illustrated. And ink in relief printing plate 16 is printed onto substrate 24. The drying process of ink is carried out if necessary. An organic luminous layer is formed on substrate 24 by the above described process.

Relief printing method is described as using a relief printing plate in the broad sense. Relief printing method of the present invention is a printing method which uses a relief printing plate comprising rubber printing plate or resin printing plate. In addition, a printing method which uses rubber relief printing plate is referred to as flexography in the printing industry. In addition, a printing method which uses plastic plate is referred to as the plastic plate printing method. However, a printing method of both is referred to as relief printing method in the present invention.

Relief printing plate made of a photosensitive resin can be used as the resin relief printing plate of the present invention.

Relief printing plate with the use of a photosensitive resin can be produced by exposure process, development process and bake process. In development process, solvent or water can be used. In other words solvent development type washing away resin by solvent and water development type washing away resin by water can be used. Main component of a printing material is hydrophobic component or a hydrophilic component respectively. The solvent development type photosensitive resin relief printing plate having a main component that is hydrophobic can not resist an aromatic organic solvent system such as toluene or dimethylbenzene which are solvents for organic luminescence ink. Therefore, solvent development type photosensitive resin relief printing plate is inappropriate for a printing material for organic electroluminescent printing. However, photosensitive resin relief printing plate of the water development type which has a hydrophilic component resists aromatic type organic solvents. According to the present invention, it is desirable to use relief printing plate of a water development type photosensitive resin.

After the formation of organic luminous layer 4, the second electrode 5 is formed. A material which depends upon luminescence property of an organic luminous layer can be used as material of cathode layer 6. In some embodiments, the following materials can be used: Metal simple substance such as lithium, magnesium, calcium, ytterbium, aluminium, gold, silver and alloys or combination thereof. In addition, conductive oxides such as indium, zinc and tin can be used. The vacuum evaporation using masks can be used as a formation method of a cathode layer.

Glass cap and adhesive are used, and this organic electroluminescent assembly is sealed last to protect this organic electroluminescent assembly from external oxygen and moisture. In this way, organic electroluminescent device can be obtained. In addition, by means of using an agent to seal and flex film and glass plate, this organic electroluminescent assembly may be sealed.

In some embodiments, the organic electroluminescent device can have the following configuration: A hole transport layer and an organic luminous layer can be sequentially laminated between the first electrode which is anode and the second electrode which is cathode from anode layer side. As described earlier, a hole injection layer, a hole transport layer, and an electron blocking layer, a hole blocking layer, an electron transport layer, an electron injection layer can be selected besides an organic luminous layer between anode and cathode if necessary.

In addition, a hole transport layer, a hole injection layer, and an electron blocking layer are layers having material having hole transport characteristics and/or an electron block characteristics. Each layer plays the following role: barrier of hole injection from anode to an organic luminous layer is reduced; a hole injected from anode is pushed forward to direction of cathode; and while maintaining a hole, electron going to the anodal direction is disturbed.

A hole blocking layer, and an electron transport layer are layers having material having electron transport property and/or a hole block characteristics. They play the following role respectively: electron injected from cathode is pushed forward to direction of anode; and while maintaining the electron, the hole that goes to direction of a cathode layer is disturbed.

In some embodiments, in present specification, the first electrode is anode, and the second electrode is cathode. Alternately, the first electrode may be cathode, and the second electrode may be anode.

Example 1

An example of organic electroluminescent device of passive matrix method of the present invention is shown below.

At first a glass substrate having ITO of thickness 150 nm was prepared. Pixel electrodes comprising ITO transparence stripe electrodes were made by a photolithography method. ITO transparence stripe electrodes are 0.166 mm pitch. In addition, ITO transparence stripe electrodes are 0.136 mm width. This substrate was washed by normal wet processing such as acetone, pure water, brush cleaning, ultrasonic cleaning next. And this substrate was washed by UV ozonization.

Positive regist ZWD6216-6 (a product made in Nippon Zeon Corporation) was coated with thickness of 0.3 μm in a whole area by means of spin coater next. Pattern of about 50 μm width was formed on ITO stripe gap by photolithography. By about 200 degrees Celsius bake, the first partition wall was formed. Sputtering method was used, and Cr was layered on a whole area next. By photolithography, the second partition wall of 30 μm width was formed in middle of the first partition wall afterwards.

The hole transport ink which poly (3,4-ethylenedioxy thiophene) (PEDOT) was dispersed in water was used next. This hole transport ink was used, and a hole transport layer was formed by spin coating method. Organic luminescence ink having the polyphenylene vinylene derivative which was organic luminescent material was prepared for next. Density of a polyphenylene vinylene derivative is 1%. Solvent is toluene. This organic luminescence ink was used, and an organic luminous layer was formed by relief printing method right above pixel electrodes between partition walls.

Thereupon, a cathode layer comprising of Al, Ca was formed. Mask evaporation method by resistance heating evaporation method was applied to the formation of a cathode layer. A pattern of a cathode layer was form of line. A line-shaped cathode layer is perpendicular to line pattern of anode electrodes. Glass cap and adhesive were used, and this organic electroluminescent assembly was sealed last to protect this organic electroluminescent assembly from external oxygen and moisture. In this way organic electroluminescent display unit was obtained. There are fetch electrode of an anode side and fetch electrode of a cathode side in a penumbra of display of an organic electroluminescent display unit. By means of connection to power supply of takeout electrode, display of organic electroluminescent device was confirmed.

As a result, emitting state of a provided organic electroluminescent display unit was good, and the luminance unevenness in a pixel and the luminescence failure by dielectric breakdown and a short circuit were not confirmed.

Example 2

Positive regist ZWD6216-6 (a product made in Nippon Zeon Corporation) was coated with thickness of 0.3 μm in a whole area by spin coater. The second partition wall of 30 μm width was formed by photolithography afterwards on the center of the first partition wall. Organic electroluminescent device was formed same as example 1 besides a formation method of the second partition wall.

Display confirmation of provided organic electroluminescent device was performed.

Emitting state was good, and the luminance unevenness in a pixel and the luminescence failure by dielectric breakdown and a short circuit were not confirmed.

Effects of the Invention

In the present invention, partition wall consists of the first partition wall and the second partition wall. The first partition wall of insulating properties covers one part of the first electrode. The second partition wall is located in an inner side of the first partition wall. Height of the first partition wall is equal to or less than 0.5 μm. Therefore, electric current flows through only a part of pixel electrodes except a part provided with the first partition wall. Only a part of uniform thickness of an organic luminous layer emits light.

In other words, on a part near the partition wall that change of organic luminescence layer thickness is big, there is step formed by the first partition wall and the second partition wall. Electric current does not flow to the part of this step. Therefore, an organic electroluminescent display unit without unevenness in a pixel and dielectric breakdown by electric field concentration is provided.

In addition, when height of the second partition wall is more than 0.3 μm, organic luminescence ink does not spread to the next pixel electrodes. Therefore, organic electroluminescent display unit without color contamination can be obtained.

In addition, organic luminescence ink is printed onto the first electrode partitioned off by partition walls by relief printing method. Therefore, a whole area in pixel electrodes is printed. An organic electroluminescent display unit is made without ink being repelled.

What is claimed is:

1. A method for manufacturing an organic electroluminescent device comprising
   a substrate,
   a first electrode on the substrate,
   a partition wall, next to the first electrode,
   an organic luminescence media layer including an organic luminous layer on the first electrode,
   and
   a second electrode which is on the organic luminescence media layer and facing the first electrode,
   wherein the partition wall comprises a first partition wall of a metal nitride and a second partition wall located on an inner side of the first partition wall,
   wherein the second partition wall is formed of a light hardening resin into which an ink repellent material is incorporated,
   and
   wherein the first partition wall covers a part of the first electrode, the method comprising:
   making a convex part of a relief printing plate touch a printed part, thereby burying the relief printing plate in a space partitioned off by a partition wall,
   wherein the organic luminous layer is formed by expanding an organic luminescence ink on the printed part partitioned off by the partition wall so that a part in which the biggest change of the organic luminous layer thickness is located is on the first partition wall.

2. The method for manufacturing an organic electroluminescent device according to claim 1, wherein the light hardening resin is polyimide resin.

3. The method for manufacturing an organic electroluminescent device according to claim 1, wherein the light hardening resin is novolac resin.

4. The method for manufacturing an organic electroluminescent device according to claim 1,
   wherein height h1 of the first partition wall is equal to or less than 0.5 μm.

5. The method for manufacturing an organic electroluminescent device according to claim 1,
   wherein height h2 of the second partition walls is more than 0.3 μm, and
   wherein a total height of the first partition wall and the second partition wall is less than 5.0 μm.

6. The method for manufacturing an organic electroluminescent device according to claim 1,
   wherein the relief printing plate is a water development type photosensitive resin and
   wherein a solvent included in an organic luminescence ink is an aromatic organic solvent.

7. A method for manufacturing an organic electroluminescent device comprising
   a substrate,
   a first electrode on the substrate,
   a partition wall, next to the first electrode,
   an organic luminescence media layer including an organic luminous layer on the first electrode,
   and
   a second electrode which is on the organic luminescence media layer and facing the first electrode,
   wherein the partition wall comprises a first partition wall of a metal nitride and a second partition wall located on an inner side of the first partition wall,
   wherein the second partition wall is formed of a light hardening resin into which an ink repellent material is incorporated,
   wherein the light hardening resin is polyimide resin,
   wherein height h1 of the first partition wall is equal to or less than 0.5 μm,
   wherein height h2 of the second partition walls is more than 0.3 μm,
   wherein a total height of the first partition wall and the second partition wall is less than 5.0 μm,
   and
   wherein the first partition wall covers a part of the first electrode,
   the method comprising:
   making a convex part of a relief printing plate touch a printed part, thereby burying the relief printing plate in a space partitioned off by a partition wall,
   wherein the organic luminous layer is formed by expanding an organic luminescence ink on the printed part partitioned off by the partition wall so that a part in which the biggest change of the organic luminous layer thickness is located is on the first partition wall,
   wherein the relief printing plate is a water development type photosensitive resin and
   wherein a solvent included in the organic luminescence ink is an aromatic organic solvent.

* * * * *